United States Patent
Bolender et al.

(10) Patent No.: US 6,943,705 B1
(45) Date of Patent: Sep. 13, 2005

(54) METHOD AND APPARATUS FOR PROVIDING AN INTEGRATED MEMBRANE SWITCH AND CAPACITIVE SENSOR

(75) Inventors: Robert James Bolender, Davis, CA (US); Wendy H. W. Cheng, Santa Clara, CA (US)

(73) Assignee: Synaptics, Inc., San Jose, CA (US)

( * ) Notice: Subject to any disclaimer, the term of this patent is extended or adjusted under 35 U.S.C. 154(b) by 537 days.

(21) Appl. No.: 10/251,563

(22) Filed: Sep. 19, 2002

Related U.S. Application Data

(60) Provisional application No. 60/377,932, filed on May 3, 2002.

(51) Int. Cl.[7] ............................................ H03M 11/00
(52) U.S. Cl. .................. 341/33; 341/10; 178/19.03; 345/173; 345/174; 200/600
(58) Field of Search .................. 178/19.03; 345/173, 345/174; 341/20, 33; 335/205; 338/13; 200/600

(56) References Cited

U.S. PATENT DOCUMENTS

| | | | | |
|---|---|---|---|---|
| 4,373,122 A | * | 2/1983 | Frame .......................... 200/600 |
| 4,444,998 A | | 4/1984 | House ............................ 178/19 |
| 4,484,026 A | | 11/1984 | Thornburg ...................... 178/18 |
| 4,494,105 A | | 1/1985 | House .......................... 338/114 |
| 4,587,378 A | | 5/1986 | Moore ............................ 178/18 |
| 4,733,222 A | | 3/1988 | Evans ...................... 340/365 C |
| 4,855,550 A | * | 8/1989 | Schultz, Jr. .................. 200/600 |
| 4,857,684 A | * | 8/1989 | Gratke .......................... 200/600 |
| 4,975,676 A | | 12/1990 | Greenhalgh .................. 338/114 |
| 5,666,096 A | | 9/1997 | Van Zeeland ................... 335/4 |
| 5,760,715 A | * | 6/1998 | Senk et al. ..................... 341/33 |
| 5,796,355 A | * | 8/1998 | Smigelski ....................... 341/33 |
| 5,844,506 A | * | 12/1998 | Binstead ........................ 341/34 |
| 5,867,082 A | | 2/1999 | Van Zeeland ................ 335/205 |
| 5,867,111 A | * | 2/1999 | Caldwell et al. ............... 341/33 |
| 5,990,772 A | | 11/1999 | Van Zeeland ................ 335/207 |
| 6,023,213 A | | 2/2000 | Van Zeeland ................ 335/205 |
| 6,069,552 A | | 5/2000 | Van Zeeland ................. 338/92 |
| 6,130,593 A | | 10/2000 | Van Zeeland ................ 335/205 |
| 6,137,387 A | | 10/2000 | Van Zeeland ................ 335/205 |
| 6,137,427 A | * | 10/2000 | Binstead ........................ 341/33 |
| 6,262,646 B1 | | 7/2001 | Van Zeeland ................ 335/205 |
| 6,459,424 B1 | * | 10/2002 | Resman ........................ 345/173 |
| 6,723,933 B2 | * | 4/2004 | Haag et al. ................ 200/61.42 |
| 6,777,626 B2 | * | 8/2004 | Takabatake et al. ......... 200/5 A |

FOREIGN PATENT DOCUMENTS

WO     WO 01/52416 A1     7/2001     .......... H03K 17/94

* cited by examiner

*Primary Examiner*—Albert K. Wong
(74) *Attorney, Agent, or Firm*—Ingrassia Fisher & Lorenz PC

(57) ABSTRACT

A circuit assembly for providing a switch sensor and a capacitive sensor. The circuit assembly has a first pattern of conductive material in a first plane and a second pattern of conductive material in a second plane. An insulating member in an intermediate plane separates the first and second patterns. In a switch sensor area, the insulating member has openings to allow a first conductive element in the first pattern to contact a second conductive element in the second pattern responsive a force being applied to the first conductive element. In the capacitive sensor area, the insulating member maintains spacing between conductive material in the first and second patterns. The circuit assembly also includes a preventative capacitance configuration that limits non-intentional capacitive coupling in the capacitive sensor area.

88 Claims, 12 Drawing Sheets

ND APPARATUS FOR
PROVIDING AN INTEGRATED MEMBRANE
SWITCH AND CAPACITIVE SENSOR

CROSS-RELATED

This application is a utility application claiming priority to an earlier filed U.S. Provisional Application No. 60/377,932 filed May 3, 2002.

FIELD OF THE INVENTION

This invention relates to capacitive touch pad sensors. More particularly, this invention relates to incorporating a capacitive touch pad sensor into a membrane switch sensor. Still more particularly, this invention relates to a capacitive touch pad sensor produced on a circuit assembly of a membrane switch sensor while reducing non-intentional capacitive coupling in the capacitive touch pad sensor.

STATEMENT OF THE PRIOR ART

In today's society, many types of systems require two or more input devices to receive inputs from a user. A good example is a personal computer system. In a personal computer system, a keyboard device receives keystroke information from a user to receive alphanumeric inputs and a mouse or other analog pointing device receives cursor control inputs. Other examples of systems having two or more input devices include control panels on industrial equipment that have buttons or keypads to receive keystroke inputs and a joystick, a touch pad or other input device to receive directional data.

In many systems that require two or more input devices for different inputs, space for placing sensors for the input devices is at premium. Good examples are notebook personal computer systems, Internet appliances, and set-top boxes. These exemplary systems typically have a casing that houses sensors for both a keyboard input device and a pointing device.

In these systems, several different designs have been used to place sensors for a keyboard device and a pointing device into the casing. Most of these designs use separately produced sensors for the keyboard device and the pointing device. The most common type of sensor used for the keyboard device is a membrane switch sensor.

Sensing elements of a membrane switch keyboard sensor are typically constructed and operated in the following manner. Each key in the keyboard input device has a conductive element directly underneath the key. These elements form a first layer of conductive elements. Underneath the first layer of conductive elements is a layer of insulating material. For the purposes of this discussion, insulating material is nonconductive material that prevents direct electrical communication between conductors. The layer of insulating material has openings directly underneath each of the conductive elements in the first layer.

A second layer of conductive elements lies underneath the layer of insulating material. Each of the conductive elements in the second layer is aligned with one of the conductive elements in the first layer. When a user hits a key, the conductive element underneath the key on the first layer is deformed and pushed through the corresponding opening in the insulating layer. The conductive element of the first layer makes contact with the correspondingly aligned conductive element on the second layer to place the two conductive elements in direct electrical communication. Current then flows through these connected conductive elements to keyboard electronics that detects the current to indicate a keystroke.

In the exemplary systems, touch pad devices are the preferred method of providing pointing devices. The two main types of touch pad are resistive touch pads and capacitive touch pads. Resistive touch pads measure the change in potential caused by contact of two conductive elements at a particular point in response to forces applied by a user. Capacitive touch pads measure the change in capacitance created by the proximity and movement of a finger or other conductive input device to an electrode. In most of the exemplary systems, such as notebook computer systems, capacitive touch pads are typically used.

Resistive touch pad devices are similar to the keyboard device in that both use membrane switch sensors. Resistive touch pad devices are generally designed and operated in the following manner. The resistive touch pad has a first conductive element and a second conductive element directly underneath the first conductive element. Some type of insulating member interposed between the first and second conductive elements typically separates the first and second conductive elements. The first and second conductive elements are positioned such that the first conductive element may contact the second conductive element when a downward force is applied to the first conductive element.

One problem with resistive touch pad sensors is that the conductive elements are susceptible to damage and wear. Any warping of the conductive elements from bending, breaking, or misalignment may cause the conductive elements to contact and lead to false readings of touch. Alternatively, the warping may prevent contact between the conductive elements when touched and the touch is not identified.

A typical capacitive touch pad device is generally constructed and operates in the following manner. The sensor in a capacitive touch pad device has a first group of conductive leads or electrodes. The electrodes of the first group of electrodes are substantially parallel to one another and are aligned in a first direction. A second group of electrodes is underneath the first group of electrodes. The electrodes of the second group are substantially parallel to one another and are aligned along a second direction that is substantially orthogonal to the first direction. Typically, there is a layer of insulating material between the first and second groups of electrodes to prevent contact between electrodes in the first and second groups.

Capacitive touch pad electronics measure the capacitance of each of the electrodes. As a user places or moves a conductive input device over or proximate to the electrodes, the capacitance of the electrodes changes. For the purposes of this discussion, a conductive input object is a finger, another body part of a user, stylus, or any other conductive device with sufficient capacitive coupling to the electrodes. The measured changes in capacitance sensed by the capacitive touch pad electronics are then used to determine the position of the conductive input object over the sensor of the touch pad. Movement is detected by detecting the different positions of the conductive input over time.

In typical systems that utilize a keyboard device and touch pad device, the devices are manufactured separately. Separate circuit assemblies and associated electronics for each device are then installed separately into the casing of a host system. Thus, the circuit assemblies for the sensor elements for the keyboard device and the touch pad device are also manufactured and installed separately. It is a desire of those skilled in the art to integrate the circuit assemblies for the two sensor elements onto one circuit assembly.

The integration of the two circuit assemblies of the membrane switch keystroke sensor and touch pad sensor onto one circuit assembly is desirable for many reasons. One advantage of a single circuit assembly is a reduction of the equipment and knowledge needed to manufacture the two sensors. A second advantage is a time saving of installing one circuit assembly into a base. A third advantage is the reduction in component count. Other advantages include reduced of costs from economies of scale, reduced materials, and reduced time needed to produce the sensor circuit assemblies.

In the past, efforts to integrate the two circuit assemblies of two types of sensors onto one circuit assembly have focused on the use of a resistive touch pad device and keyboard device. Resistive touch pads have been used because resistive touch pad sensors, like the membrane switch keystrokes sensors of keyboard devices, are membrane switch sensors. In contrast, sensors in capacitive touch pads utilize a totally different technology base than membrane switch keystroke sensors.

However, incorporating resistive touch pad membrane switch sensors and membrane switch keystroke sensors yield non-optimal solutions since resistive sensors often require more costly and significantly different manufacturing and assembly processes then membrane switch keystroke sensors. Further, capacitive touch pad devices are the norm in most systems providing a pointing device using a touch pad. Therefore, there is a need in the art for a single circuit assembly that provides sensor elements for a membrane switch keyboard device and capacitive touch pad device.

SUMMARY OF THE INVENTION

This invention incorporates a membrane switch keystroke sensing element of a keyboard device and a sensing element of a capacitive touch pad device onto one circuit assembly. The circuit assembly has a preventative capacitance configuration that limits non-intentional capacitive couplings that may give false readings in a capacitive touch pad sensor. This allows a producer of such devices to take advantage of economies of scale, to reduce the amount of material, time, knowledge base, and equipment needed to produce sensor circuit assemblies, to simplify installation of circuit assembly into a base and to reduce component count.

In accordance with this invention, a sensor circuit assembly includes a switch sensor area, a capacitive sensor area, and a preventative capacitance configuration. The switch sensor area includes a first conductive element, a second conductive element and an insulating member. The first conductive element is in conductive material of a first pattern oriented in a first plane. The second conductive element is in conductive material of a second pattern oriented in a second plane. The second plane is substantially parallel to the first plane. The insulating member maintains separation of the first and second conductive elements and allows electrical contact between the first conductive element and the second conductive element when a force is applied to the first conductive element.

The capacitive sensor area of the circuit assembly includes a portion of a first layer of conductive material. The first layer of conductive material is in either the first pattern or second pattern of conductive material.

The circuit assembly also includes a preventative capacitance configuration. The preventative capacitance configuration limits non-intentional capacitive coupling between the portion of the first layer in the capacitive sensor area and other objects in the environment. By limiting non-intentional capacitive coupling with other objects in the environment, the circuit assembly of this invention increases the accuracy of a determination of the measured capacitance in the capacitive sensor area. This increase in accuracy of the measured capacitance, in turn, increases the accuracy of the properties measured by the capacitance sensor.

The preventative capacitance configuration may include a conductor held at a substantially constant voltage in the pattern that includes the first layer. The conductor is between the switch sensor area and the capacitive sensor area. The conductor reduces reception of signals from the switch sensor area in the capacitive sensor area. Preferably, the constant voltage of the conductor is held at ground.

Alternatively, the preventative capacitance configuration may include spacing the switch sensor area and the capacitive sensor area sufficiently apart from one another. The spacing of the areas apart from one another reduces the reception of signals from the switch sensor area in the capacitive sensor area.

In order to detect the position of the conductive input object, the portion of the first layer of conductive material in the capacitive sensor area may have electrodes defined in the conductive material. The electrodes are aligned substantially along a first axis to sense the position of conductive input in a direction substantially perpendicular to the first axis.

Conductors connect the electrodes to sensor electronics. The conductors may be traces of conductive material within the first layer. In order to limit non-intentional capacitive coupling to the conductors, the preventative capacitance configuration may route at least one of the conductors around areas proximate to positions of other objects in the environment.

The preventative capacitance configuration may also include shielding between other objects in the environment and the conductors. The shielding reduces non-intended capacitive coupling between the conductors and other objects.

To further limit non-intentional capacitive coupling between the conductor and other object in the environment, the preventative capacitance configuration may include a casing enclosing the conductors. The casing defines an air gap between an inner surface of the casing and the conductors. The air gaps reduce non-intended capacitive coupling between other objects in the environment and the conductors.

The preventative capacitance configuration may also include a conductor held at a substantially constant voltage placed between at least a portion of the first layer and other objects in the environment to reduce non-intended capacitive coupling between the other objects in the environment and the conductors.

In some embodiments of this invention, the capacitive sensors may have two layers of conductive material in the capacitive sensor area. This may allow the capacitive sensor to determine the position of the conductive input in two dimensions. In these embodiments, the circuit assembly may include a portion of a second layer of conductive material in the capacitive sensor area. The second layer of conductive material may be in a second one of the first and second patterns of conductive material or in a third pattern of conductive material distinct from the first and second patterns. When the first and second layers of conductive material in the capacitive sensor area are included in the first and second patterns, the insulating member may maintain separation between the first pattern and the second pattern in said capacitive sensor area.

In embodiments having two layers of capacitive material in the capacitive sensor area, a position of the conductive input object with respect to the capacitive sensor area is determined without contact between the conductive material of the first and second layers. The position of the conductive input object may also be determined without substantial relative movement of the conductive material of the first and second layers in the capacitive sensor area.

In embodiments having two layers of conductive material in the capacitive sensor area, the preventative capacitance configuration may limit non-intentional capacitive coupling between objects in the environment and the second layer of material in the capacitive coupling area. The preventative capacitance configuration may reduce capacitive coupling between the first and second layers.

In one embodiment, non-intentional capacitive coupling between the layers may be reduced by the insulating member. An opening through the insulating member in the capacitive sensor area forms an air gap between the layers.

In another embodiment, the preventative capacitance configuration may also provide shielding between at least a portion of the conductive material in the first layer and at least a portion of the conductive material in the second layer. The shielding reduces capacitive coupling between the conductive material in the first and the second layers. In an exemplary embodiment, the shielding includes a conductor between the first and second layers that is held at a substantially constant voltage.

When the capacitive sensor area includes a first and second layer, a first group of electrodes may be defined in the conductive material of the first layer and a second group of electrodes may be defined in the conductive material of the second layer. The electrodes of the first group are aligned substantially along a first axis and electrodes of the second group are aligned substantially along a second axis nonparallel to the first axis. Each group of electrodes is used to determine a position of a conductive input device in a dimension substantially perpendicular to the electrodes.

A first group of conductors connects the first group of electrodes to the capacitive sensor electronics and a second group of conductors connects the second group of electrodes to the capacitive sensor electronics. Preferably, the conductors of the first group are traces of conductive material within the first layer and the conductors of the second group are traces of conductive material in the second layer.

The preventative capacitance configuration may limit non-intentional capacitive coupling to the conductors by including a conductor held at a substantially constant voltage between at least a portion of the second layer and other objects in the environment. Preferably, the contact is held constant to ground. The preventive capacitance configuration may also provide shielding between at least part of the first group of conductors and positions of other objects in the environment.

The preventive capacitance coupling may also provide shielding between at least a part of the second group of conductors and positions of other objects in the environment to reduce non-intended coupling effects of between the other objects and the second group of conductors. Furthermore, the preventive capacitance configuration may include routing at least one of the first and/or second group of conductors around areas corresponding to regions proximate other objects in the environment.

The preventative capacitance configuration may also include a casing. The casing encloses the second group of conductors. Air gaps are defined by the casing between an inner surface of the casing and the second group of conductors. The air gaps reduce non-intended capacitive coupling between other objects in the environment and said second plurality of conductors.

The casing may also enclose the entire switch sensor and capacitive sensor areas. A bezel in a first surface of the casing may demark the capacitive sensor area to the user. The bezel may be an opening in the casing. Alternatively, the bezel may be a textured region over the capacitive sensor area.

Furthermore, a brace member proximate to the bezel may clamp the first and/or second patterns in the capacitive sensor area in place against a second surface inside the casing. A localized clamping region of the brace member proximate to the capacitive sensor area may hold at least the first layer of conductive material in the capacitive sensor area in place against the bezel.

In order to add stability to the circuit assembly and hold conductive material in place to add precision to the measured properties, the circuit assembly may include a registration member that secures the position of the first pattern with respect to the second pattern. The registration member may also be used to hold the insulating member in place with respect to the first pattern and the second pattern. The registration member may also be provided by nibs on the two surfaces of the insulating member and openings through substrates to which the first and second patterns are affixed. Another embodiment of the registration member is a structural component that fits through opening in the substrates to which the first and second patterns are affixed.

The registration member may also be a coupling of the first pattern and the second pattern that holds the first pattern, the insulating member and the second pattern substantially in place with respect to one another. This coupling may provide additional stiffness to the circuit assembly.

The coupling may be a heat staking connecting the first and second patterns. The coupling may also be an adhesive connecting substrates of the first and second patterns. The coupling may also be provided by placing the first and second patterns on opposite sides of a single substrate.

The circuit assembly may also include a layer of textured material over the capacitive sensor area. The textured material provides an aesthetic feeling of touch to the user. The textured material may also stiffen the circuit assembly. Preferably, the textured material is a polyester material.

BRIEF DESCRIPTION OF THE DRAWINGS

The features and advantages of this invention are set forth in the Detailed Description given below and the following drawings.

DETAILED DESCRIPTION

The present invention relates to a circuit assembly for providing keystroke and analog pointing device sensors in a device. This invention is described below in conjunction with the drawings previously described. Corresponding elements on these drawings are given like reference numbers and these reference numbers throughout the description given below refer to numbered elements.

Figure 1:
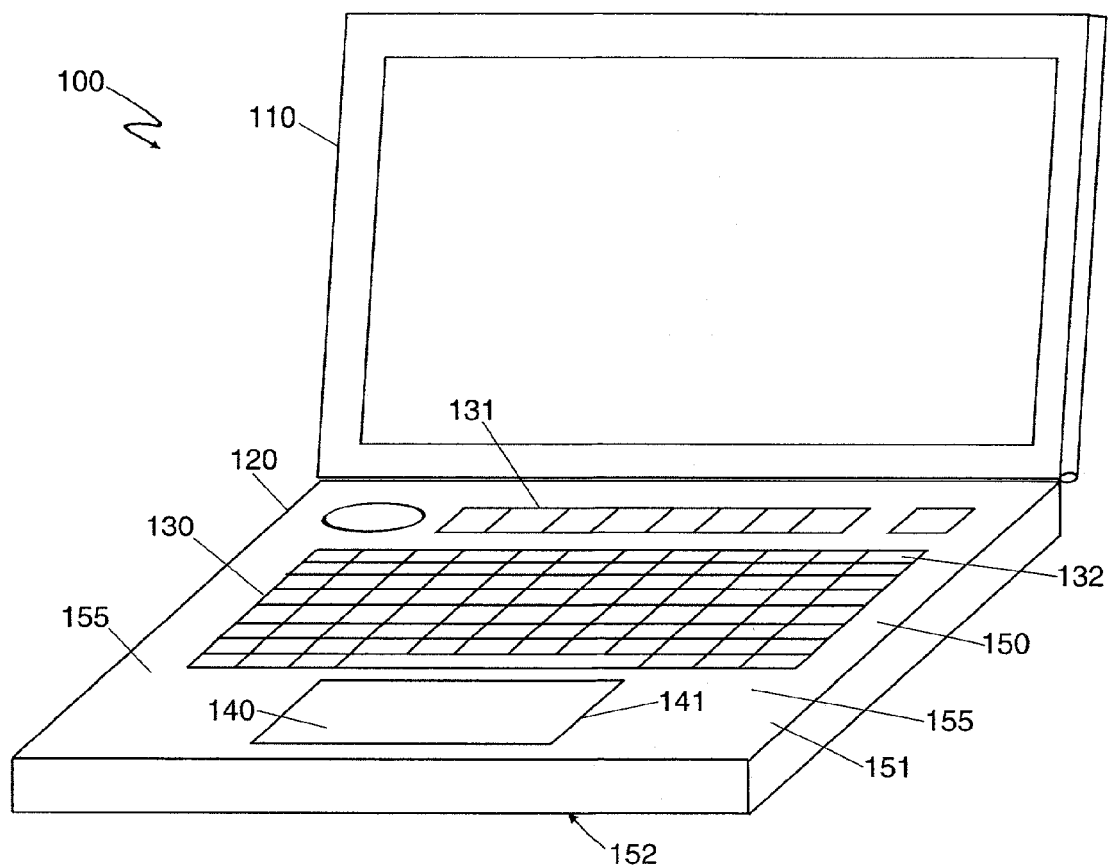
FIG. 1 illustrating a notebook computer system incorporating a sensor circuit assembly in accordance with this invention.

FIG. 1 illustrates a notebook computer system 100 that incorporates a sensor circuit assembly in accordance with this invention. One skilled in the art will note that the notebook computer system 100 is a non-limiting example and this invention may be used in other systems including but not limited to keyboards for desktop computers, internet appliances, portable electronic devices, other types of computer systems, and control panels. Notebook computer system 100 has a monitor 110 and base 120. Monitor 110 is a Liquid Crystal Display (LCD) or other flat video device that may be installed in the constraints of a small cover of notebook system 100.

Base 120 has a casing 150. Casing 150 houses the computer electronics, such as the Central Processing unit, memory, and other devices that are not essential to this invention and are omitted for brevity. Top cover 151 of casing 151 exposes a keyboard 130 and a touch pad 140. Keyboard 130 allows a user to input alphanumeric information via alphanumeric keys 132 and provides control buttons 131 for controlling operation of notebook computer 100.

Touch pad 140 acts as a pointing device. Touch pad 140 senses movements of a body part or other conductive input device across touch pad 140. Typically, the body part used by a user is a finger that is moved across touch pad 140. However, one skilled in the art will recognize that any other body part or other conductive input devices with a sufficient capacitive coupling, such a stylus may be used. Touch pad 140 operates by measuring the position of the body part or other conductive input device at intervals of time. The notebook processor then uses the changes in position of the body part to move a cursor across a display. Touch pad 140 is exposed through top cover 151 by bezel 141. Bezel 141 is an opening through top cover 151. Preferably, bezel 141 has tapered sides to indicate the edges of touch pad 140 to a user via touch. One skilled in the art will appreciate that touch pad 140 and bezel 141 may be other non-rectilinear, shapes or sizes depending on the needs of the designer. One skilled in the art will recognize that touch pad 140 may be positioned in other locations and is shown in this location only for exemplary purposes. For example, if touch pad 140 senses motion in only one direction, touch pad 140 may be more elongated, narrower, and located on a side of top cover 151.

One skilled in the art will recognize that other embodiments of the bezel 141 may be used. For example, bezel 141 may be a solid region in top cover 151 over touch pad 140. When touch pad 140 is not exposed, bezel 141 may be made thinner than the rest of top cover 151 to improve coupling of the touch pad sensor to a conductive object used by a user to improve sensitivity. This also allows bezel 141 to be used to clamp touch pad 140 against a second surface in the casing.

In addition, bezel 141 may include features such as textures, ridges, grooves, or graphics within the region above touch pad 140 or proximate to the perimeters of touch pad 140 to indicate the location of touch pad 140.

Top cover 151 also includes hand rests 155. Hand rests 155 provide a region upon which the hands of a user may be rested or over which hands may hover during operation of notebook system 150. Bottom cover 152 provides a base upon which notebook computer system 100 rests. One skilled in the art will recognize that some systems of notebook system 100 have been omitted for brevity.

Figure 2:
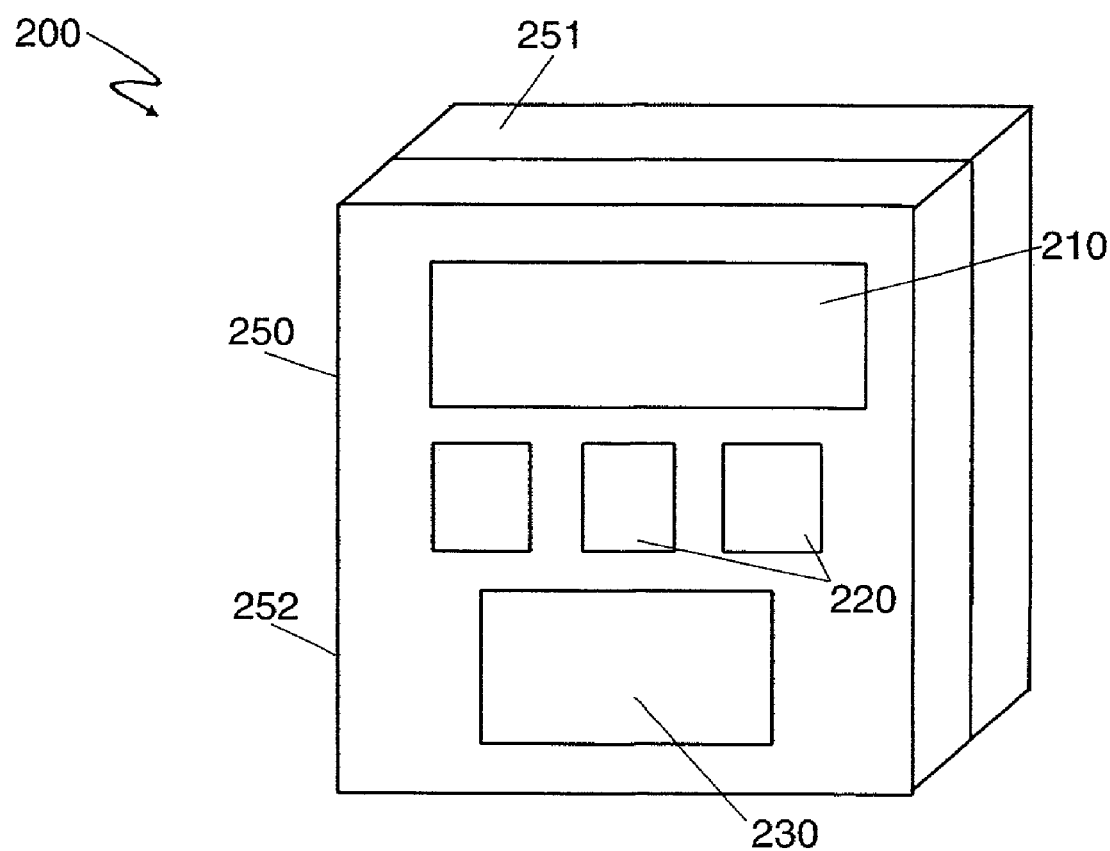
FIG. 2 illustrating a control panel incorporating a sensor circuit assembly in accordance with this invention.

FIG. 2 illustrates a second non-limiting example of control panel 200 for a piece of industrial equipment that includes this invention. One skilled in the art will recognize that the particular type of industrial equipment is unimportant for the present discussion. Further, the particular function of the control panel is unimportant for this discussion. Control panel 200 has a casing 250 having a front cover 252 and a rear cover 251. Casing 250 houses all electronics necessary for operation of control panel 200. Front cover 252 has openings exposing display 210, control buttons 220, and touch pad 230. Display 210 is used to display information generated by the electronics in control panel 200. Control buttons 220 provide keys that a user may press to perform any of a variety of functions. Control buttons 220 operate in the same manners as keys in keyboard 130 of notebook computer system 100 depicted in FIG. 1 and described above.

Touch pad 230 senses the touch of a user to move through selections on display 210. Touch pad 230 may sense the position of a body part in one dimension or two dimensions. For example, touch pad 230 may only sense the vertical position of the body part along the pad or touch pad 230 may sense both the vertical and the horizontal positions of the body part on the pad. Only one dimension is needed when a cursor is only moved in one direction for such functions such as scrolling through a list. However, two dimensions may be needed for moving such functions as moving a cursor across a screen. One skilled in the art will recognize that touch pad 230 may be positioned in other locations and is shown in this location only for exemplary purposes. For example, if touch pad 230 senses motion in only one direction, touch pad 230 may be on the side of control panel 200. Furthermore, touch pad 230 may also estimate the force or pressure applied to touch pad 230 by a body part of the user by monitoring the area of contact between a user and touch pad 230. For example, as a user increases the force applied by a finger on touch pad 230, the finger flattens and splays out, increasing the area of contact between the finger and touch pad 230.

This invention integrates the sensor elements of the keyboard device and touch pad device into one assembly for easier installation, shorter production time, more efficient material use, and lower production component count. The circuit assembly includes a preventative capacitance configuration that limits non-intentional capacitive coupling between a capacitive sensor and objects in the environment other than a conductive input object. One skilled in the art will recognize that this invention relates to the circuit assembly used to provide sensors of the input devices in a system and the conductors that link these sensors to the associated electronics that receive and process detected signals. This invention does not include these associated electronics that receive and process detected signals. One skilled in the art will also recognize some operational modifications of the associated electronics may be needed.

FIGS. 3–9 illustrate the placement of conductive material in switch sensors area 301 and capacitive sensor area 302 on various substrates in circuit assembly 300. FIGS. 10–18 illustrate an exemplary embodiment of this invention illustrate the operation of circuit assembly 300 and the preventative capacitance configurations included in circuit assembly 300 in accordance with this invention to limit non-intentional capacitive coupling. The preventative capacitance configuration increases the accuracy of the measured capacitance of conductive material in capacitive sensor 300 to increase the accuracy of properties measured by a capacitive sensor.

Figure 3:
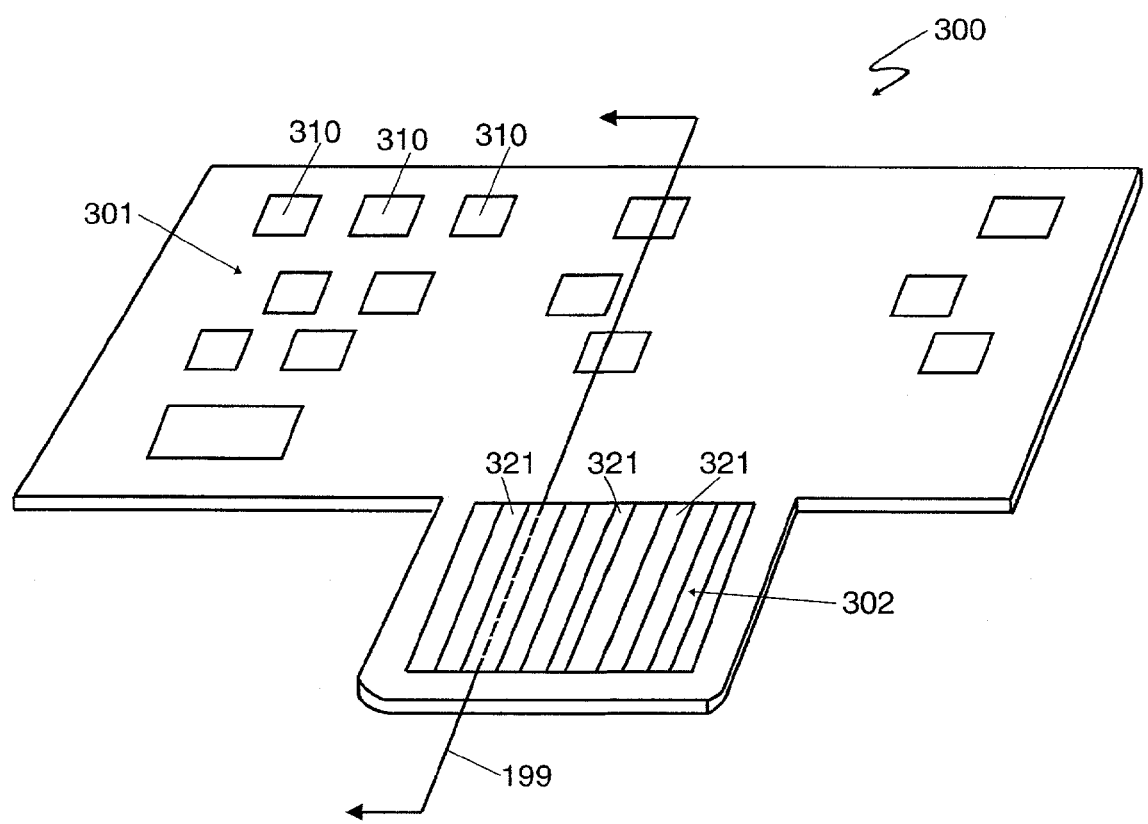
FIG. 3 illustrating an isometric view of a circuit assembly in accordance with this invention.

FIG. 3 illustrates an isometric view of circuit assembly 300. Circuit assembly 300 includes switch sensor area 301 and capacitance sensor area 302. Switch sensor area 301 includes the conductive material that provides membrane switch sensors for a keyboard device. Capacitance sensor area 302 includes the conductive material that provides sensor elements for a touch pad device. In FIG. 3, conductive elements 310 in switch sensor area 301 are shown and conductive electrodes 321 of a first layer in capacitive sensor area 302 are shown.

Figure 4:
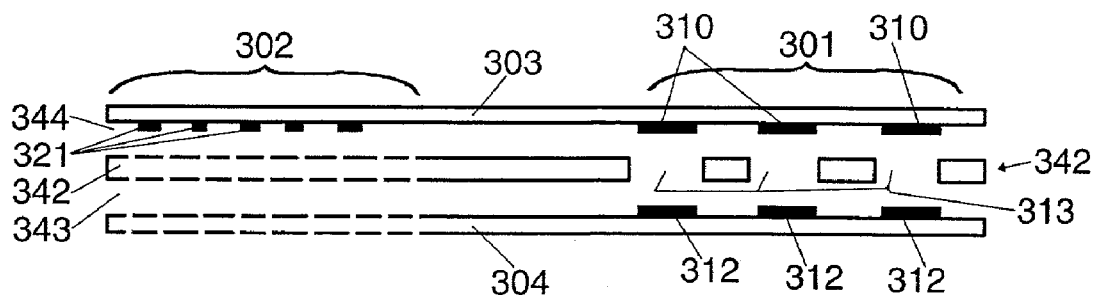
FIG. 4 illustrating a cross section view of the circuit assembly along line 199 to show a first embodiment of a circuit assembly having one layer of conductive material in a capacitive sensor area.
Figure 5:
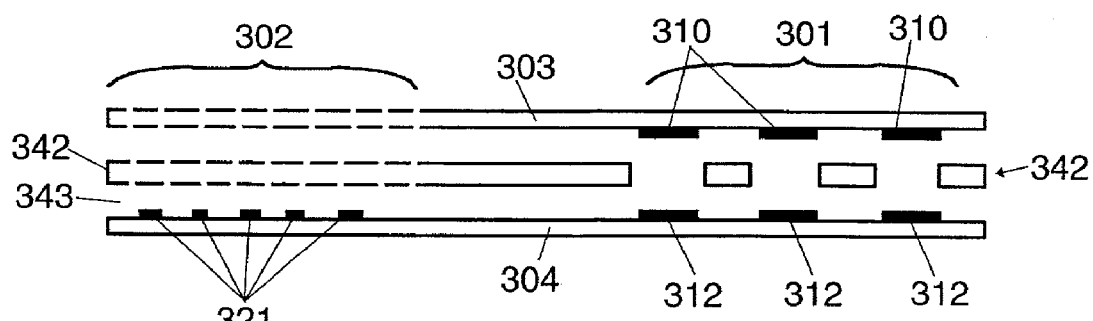
FIG. 5 illustrating a cross section view of the circuit assembly along line 199 to show a second embodiment of a circuit assembly having one layer of conductive material in a capacitive sensor area.

FIGS. 4 and 5 illustrate a cross section of circuit assembly 300 along line 199 to illustrate a circuit assembly 300 having a portion of one layer of conductive material in capacitive sensor area 302. One layer of conductive material of conductive material is used to measure a one-dimensional property. One-dimensional properties include but are not limited to position of the conductive input device along one axis. FIG. 4 illustrates a first layer of conductive material including electrodes 321 in capacitive sensor area 302. Electrodes 321 are in a first pattern 341 of conductive material that includes conductive elements 310 in switch sensor area 301. In FIG. 4, switch sensor area has conductive elements 310 are in a first pattern 341 and conductive elements 312 in second pattern 343 of conductive material.

First pattern 341 is affixed to a bottom side of substrate 303. Second pattern 343 is affixed to a top side of substrate 304 in opposition to first pattern 341. Insulating member 342 separates first pattern 341 from second pattern 343 and is disposed between first pattern 341 and second pattern 343. Insulating member 342 includes openings 313 that allow electrical contact between mated pairs of conductive elements 310 and conductive elements 312. The operation of conductive elements 310 and 312 in the switch sensor area 301 and electrodes 321 in capacitance sensor area 302 will be described below in reference to FIG. 10.

FIG. 5 illustrates a cross sectional view of circuit assembly 300 along line 199. Capacitive sensor area 302 has one layer of conductive material illustrated as electrodes 321. However, electrodes 321 are included in second pattern 343 in FIG. 5 instead of in the first pattern 341 as shown in FIG. 4. The remaining elements shown in FIG. 5 are configured as described with respect to FIG. 4.

FIGS. 6–9 illustrate cross sectional views of different embodiments of circuit assembly 300 along line 199. In FIGS. 6–9, capacitive sensor area 302 includes a first layer and second layer of conductive materials. The first layer is represented by electrodes 321. The second layer is represented by electrodes 323. Although four different embodiments are shown, one skilled in the art will recognize that any combination of the two layers may be used. This includes having one layer in first pattern 341 or in second pattern 343 and the second layer in a third pattern. The third pattern may be the remaining one of first and second patterns 341 and 343 or in a third pattern elsewhere in circuit assembly 300.

Figure 6:
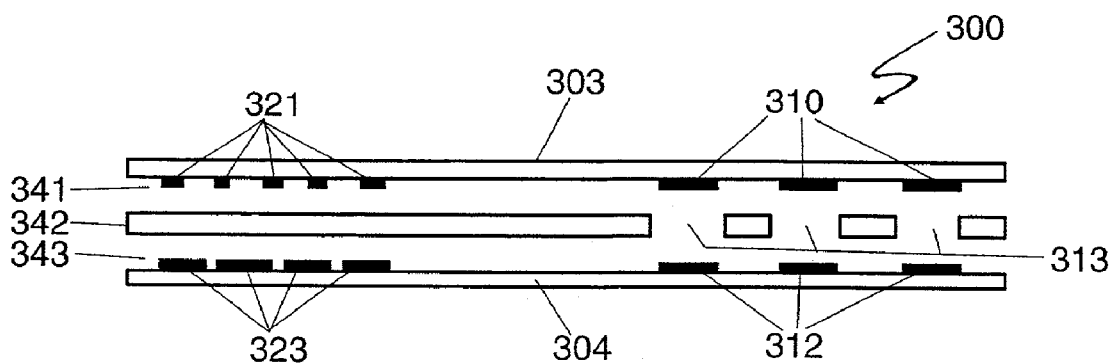
FIG. 6 illustrating a cross section view of the circuit assembly along line 199 to show a first embodiment of a circuit assembly having two layers of conductive material in a capacitive sensor area.

FIG. 6 illustrates a first layer of conductive material including electrodes 321 and a second layer of conductive material including electrodes 323 in capacitive sensor area 302. Electrodes 321 are in a first pattern 341 of conductive material that includes conductive elements 310 in switch sensor area 301. Electrodes 323 are in a second pattern 343 of conductive material that includes conductive elements 312 in switch sensor area 301.

In FIG. 6, first pattern 341 is affixed to a bottom side of substrate 303. Second pattern 343 is affixed to a top side of substrate 304 in opposition to first pattern 341. Insulating member 342 separates first pattern 341 from second pattern 343 and is disposed between first pattern 341 and second pattern 343. Insulating member 342 includes openings 313 that allow electrical contact between mated pairs of conductive elements 310 and conductive elements 312 in switch sensor area 301. In capacitive sensor area 302, insulating member 342 maintains separation between electrodes 321 and 323. The operation of conductive elements 310 and 312 in the switch sensor area 301 and electrodes 321 and 323 in capacitance sensor area 302 will be described below in reference to FIG. 10.

Figure 7:
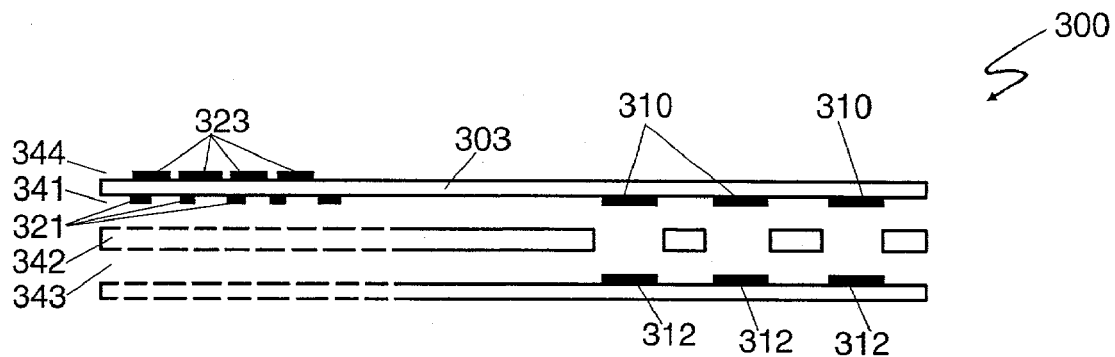
FIG. 7 illustrating a cross section view of the circuit assembly along line 199 to show a second embodiment of a circuit assembly having two layers of conductive material in a capacitive sensor area.

FIG. 7 illustrates a cross sectional view along line 199 of a second embodiment of circuit assembly 300 having two layers of conductive material in capacitive sensor area 302.

In FIG. 7, electrodes 323 are in a third pattern 344 of conductive material. Third pattern 344 is in a plane that is substantially parallel to first pattern 341, second pattern 343, and insulating member 342. In FIG. 7, third pattern 344 is affixed to a top side of substrate 303 that is opposite of the side of substrate 303 to which first pattern 341 is affixed. The other components of circuit assembly 300 shown in FIG. 7 are configured as described with reference to FIG. 6.

Figure 8:
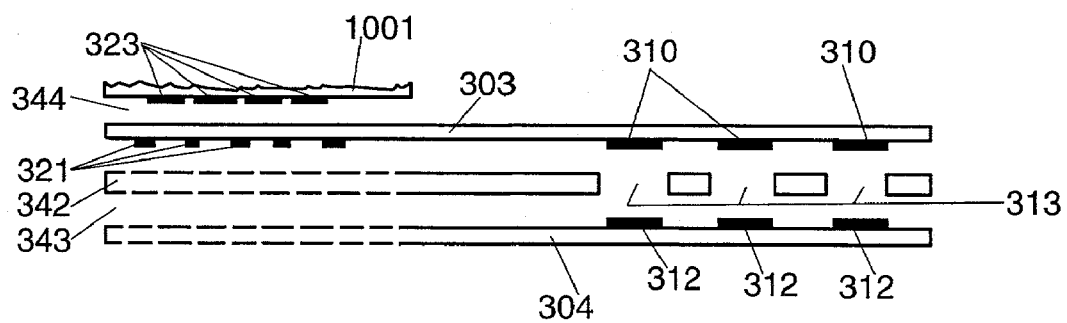
FIG. 8 illustrating a cross section view of the circuit assembly along line 199 to show a third embodiment of a circuit assembly having two layers of conductive material in a capacitive sensor area.

FIG. 8 illustrates a cross sectional view along line 199 of a third embodiment of circuit assembly 300 having two layers of conductive material in capacitive sensor area 302. In FIG. 8, electrodes 323 are in a third pattern 344 of conductive material. Third pattern 344 is in a plane that is substantially parallel to first pattern 341, second pattern 343, and insulating member 342. In FIG. 8, third pattern 344 is affixed to inner surface of textured material 1001. The other components of circuit assembly 300 shown in FIG. 8 are configured as described with reference to FIG. 6.

Figure 9:
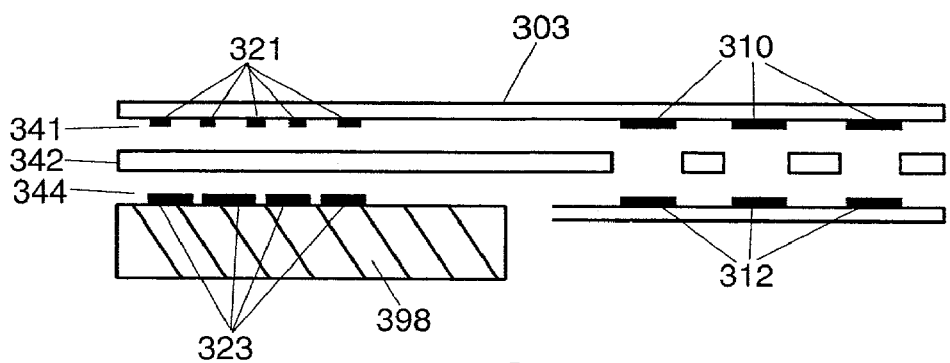
FIG. 9 illustrating a cross section view of the circuit assembly along line 199 to show a fourth embodiment of a circuit assembly having two layers of conductive material in a capacitive sensor area.

FIG. 9 illustrates a cross sectional view along line 199 of a fourth embodiment of circuit assembly 300 having two layers of conductive material in capacitive sensor area 302. In FIG. 9, electrodes 323 are in a third pattern 344 of conductive material. Third pattern 344 is in a plane that is substantially parallel to first pattern 341, second pattern 343, and insulating member 342. Third pattern 344 is affixed to a top side of a rigid substrate 398. Rigid substrate 398 is a printed circuit board in an exemplary embodiment. The other components of circuit assembly 300 shown in FIG. 9 are configured as described with reference to FIG. 6.

Figure 10:
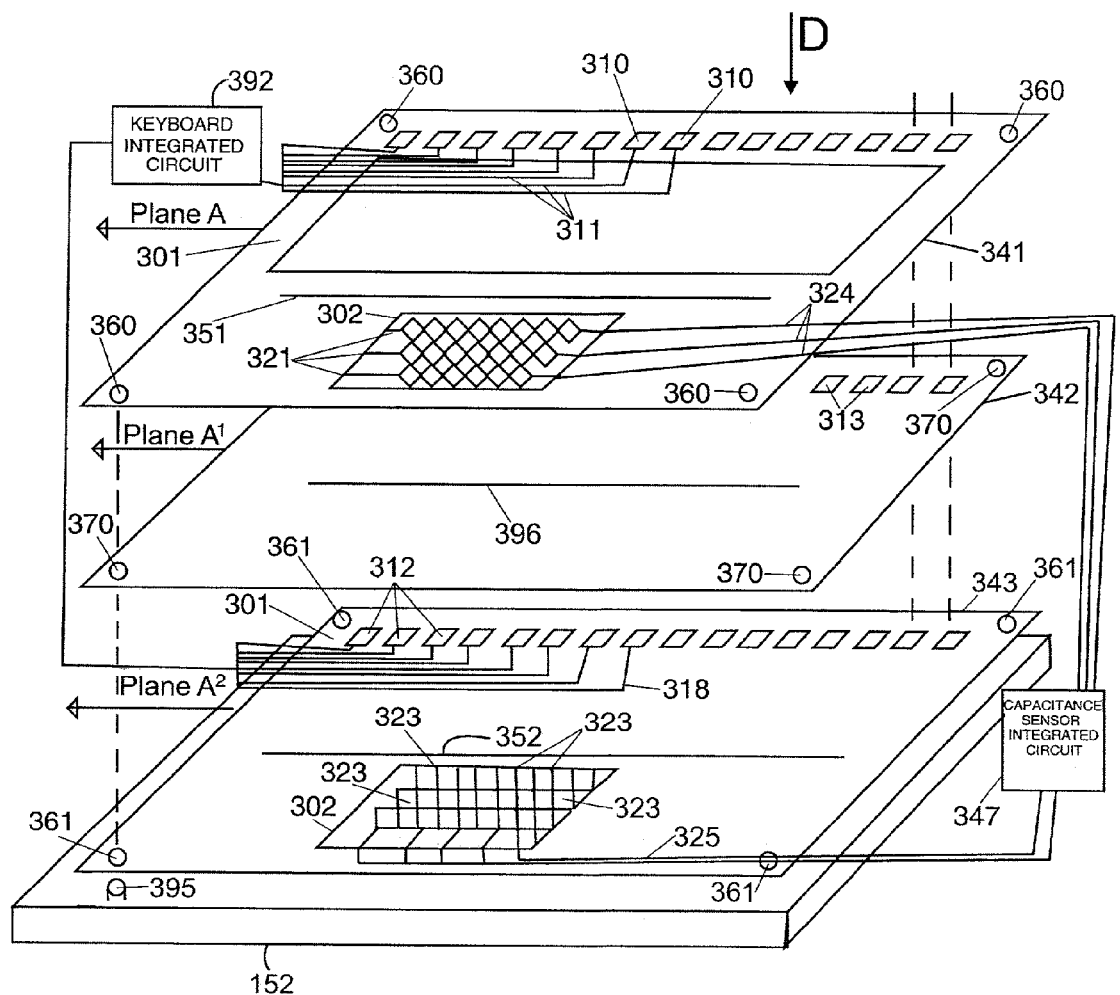
FIG. 10 illustrating an exploded view of a sensor circuit assembly in accordance with this invention.

FIG. 10 illustrates an exploded view of an exemplary sensor circuit assembly 300 for use in notebook computer system 100 (shown in FIG. 1) in accordance with this invention. One skilled in the art will recognize that this is a non-limiting example used to point out the features and advantages of this invention. Circuit assembly 300 has a membrane switch sensor area 301 and a capacitive sensor area 302 and a preventive capacitance configuration. In a preferred embodiment, switch sensor area 301 and capacitive sensor area 302 are one circuit assembly 300 and the preventative capacitance configuration includes circuitry and components which limit non-intentional capacitive coupling between conductive material in capacitance sensor area 302 and other objects. One skilled in the art will recognize that circuit assembly 300 may be one circuit assembly or any other one piece integrated component for providing the sensors. One skilled in the art will recognize that other types of sensors may be added to this circuit assembly, including but not limited to knobs, switches, duraswitches, and resistive touch sensors.

An exemplary membrane switch sensor operates in the following manner. A first conductive element 310 is in a first pattern 341 of conductive material and is connected to keyboard electronics 392 via conductor 311. One skilled in the art will appreciate that a conductive element is a contact pad, electrode, or other type of conductive circuitry. A second element 312 is aligned with first conductive element 310 and is connected to keyboard electronics 392 via conductor 319. Second conductive element 312 is on a second pattern 343 of conductive material located underneath first pattern 341. Second conductive element 312 is separated from first conductive element 310 by insulating member 342. Second conductive element 312 normally does not contact first conductive element 310 without user input.

To indicate a keystroke, first conductive element 310 is depressed by user force to contact second conductive element 312 through opening 313 in insulating member 342. This completes a circuit and a signal is transmitted to membrane switch electronics 392 via a conductor 311 and a conductor 319 to indicate the user input. This skilled in the art will recognize the above is an exemplary description of membrane switch technology which is common in the art.

The following description is an exemplary description of a capacitive touch pad device. One skilled in the art will recognize there are many other methods for providing capacitive touch pad devices well known in the art. Capacitive sensor area 302 provides a capacitive sensor that operates in the following manner. First electrodes 321 are aligned substantially parallel to one another in a first direction and are spaced evenly apart on a first layer in plane A. Conductors 324 connect first electrodes 321 to capacitive sensor electronics 391. First electrodes 321 measure a position of a conductive object along a path substantially perpendicular to the first direction.

Second electrodes 323 are aligned parallel to one another in a second direction and spaced evenly apart in a plane A". Preferably, the second direction is orthogonal to the first direction. However, the first and second axes need only be skewed and non-parallel such that the axes are not parallel and span a plane. Conductors 325 connect second electrodes 323 to capacitive sensor electronics 391.

When a conductive input object is placed in proximity of an electrode by the user, the capacitance of the electrode changes. Capacitance electronics 391 measures the capacitance of each of the first group of electrodes 321 and the second group of electrodes 323. From the measured capacitance each of the first electrodes, electronics 391 determines the position of the conductive input object in the direction substantially orthogonal to the first direction within sensor area 302. From the measured capacitance of each of the second electrodes 323, electronics 391 determines the position of the conductive input object in the direction substantially orthogonal to the second direction within sensor area 302. One skilled in the art will recognize that the measured capacitance of the electrodes may also be used to measure other properties, such as pressure of touch. One skilled in the art will also note that unlike other input devices, the capacitive touch pad device does not require physical contact between electrodes in the first and second groups of electrodes 321 and 323 to determine the position of the conductive input object. Further, one skilled in the art will also note that the capacitive touch pad device does not require movement of either the first group of electrodes 321 or the second group of electrodes 323 to determine position of the conductive object. It should also be noted that the position of a conductive input object may be measured in one dimension using one of either the first or second group of electrodes 321, 323. Thus, if it is desired to measure only the position of the conductive input object in one dimension, only one of the first or second groups of electrodes 321, 323 needs to be present in capacitive touch sensor area 302. One skilled in the art will recognize that the layout and configuration of the group of electrodes will depend on the desired sensing area and sensing dimension, and may differ from that shown in FIG. 10.

One skilled in the art will appreciate that although membrane switch electronics 392 and capacitive sensor electronics 391 are shown as separate components as is standard in the prior art, it is possible to combine electronics 391 and 392 into one integrated circuit. Also it is possible for electronics 391, 392 to share common components such as a power supply and power conditioning electronics or to share the same physical connection to a host system.

In accordance with this invention, circuit assembly 300 is constructed in the following manner. Circuit assembly 300 has a first pattern of conductive material 341, a second pattern of conductive material 343, and an insulating member 342. Circuit assembly 300 includes a switch sensor area 301 and a capacitive sensor area 302.

First pattern of conductive material 341 includes conductive elements 310 from switch sensor area 301 and first electrodes 321 of capacitive sensor area 302. First pattern of conductive material 341 is in a first plane A. Conductive elements 310 may be contact pads or electrodes that are conductive. One skilled in the art will recognize that first pattern 341 may include conductive material affixed to a first substrate or may be a first substrate of material with traces of conductive ink.

Figure 12:
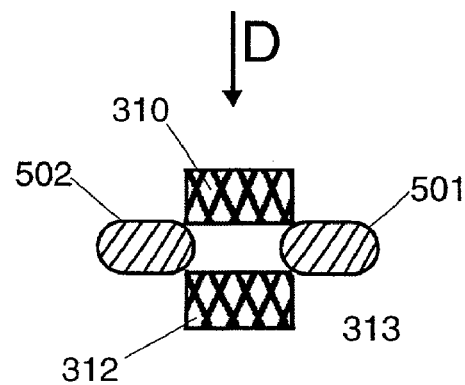
FIG. 12 illustrating a cross sectional view of a portion of an alternative exemplary embodiment of a membrane switch area in accordance with this invention.

Insulating member 342 separates first pattern 341 and second pattern 343. Insulating member is oriented in a plane A'. Plane A' is substantially parallel to Plane A. One skilled in the art will appreciate that insulating member 342 may be a solid sheet of insulating material as shown in FIG. 10, a spacer that physically separates first pattern 341 from second pattern 342 and forms air gaps between first pattern 341 and second pattern 342 as shown in FIG. 12 and described below, or a series of insulating bumps that maintain separation between first pattern 341 and second pattern 343 as shown in FIG. 12 as described below.

In switch sensor region 301, insulating member 342 has openings 313 or other structures which allow conductive elements 310 to make electrical contact with mated conductive elements 312 in second pattern 343 in response to a force exerted in direction D. In capacitive sensor area 302, insulating member 342 maintains spacing between electrodes 321 in the first pattern 341 and electrodes 323 in second pattern 343. This helps limit the relative motion between electrodes 321 and 323 that may change the capacitance sensed by capacitance touch pad electronics 391 and give an invalid reading of the position of the conductive object.

Second pattern of conductive material 343 is in a plane A" which is substantially parallel to planes A and A'. Second pattern 343 has conductive elements 312 in switch sensor area 301. Each conductive element 312 is aligned with a conductive element 310 in first pattern 341. Each aligned conductive element 312 opposes the corresponding aligned conductive element 310 and is directly underneath aligned conductive element 310. One skilled in the art will recognize that second pattern 343 may include conductive material affixed to a second substrate or may be a second substrate of material with traces of conductive ink. One skilled in the art will recognize that second pattern of conductive material 343 must be affixed or traced onto the second substrate in manner that allows electrical contact between conductive elements 310 and conductive elements 312 in switch sensor area 301.

In capacitive sensor area 302, second pattern 343 includes second electrodes 323. Second electrodes 323 are aligned in a second direction that is substantially orthogonal to the first direction. However, the first and second axes need only be skewed such that the axes are not parallel and span a plane for the capacitance touch pad device to properly sense the position of the conductive object in two dimensions. One skilled in the art will recognize that one of first or second conductors 321–323 may be omitted if the position only needs to be measured along one axis. One skilled in the art will further recognize that only discrete conductive pads, and not groups of electrodes, are necessary if only the presence or size of the touch (and not the position or motion) is desired. One skilled in the art will also recognize that the second pattern may be affixed to a substrate such as conductive ink traces defining individual components on an insulating material. One skilled in the art will further recognize that any design for a capacitive sensor may be deposited on first pattern 341 and second pattern 343.

In order to reduce signal interference from membrane switch sensor area 301 in capacitive sensor area 302, the preventative capacitance configuration of circuit assembly 300 may include a conductor 351 on the first pattern and/or a conductor 352 in the second pattern 343. Conductors 351 and 352 are held at a substantially constant voltage such as but not limited to ground. Preferably, conductors 351 and 352 are held at a voltage that reduces the magnitude of signals in membrane switch sensor area 301 from being received by first and second electrodes 321 and 323. Received signals from membrane switch sensor area 301 may affect electrodes 321 and 323 giving an invalid reading of the position of the conductive object. Further, conductor 351 on first pattern 341 may be in locations on first pattern 341 that shield conductive material in second pattern 343 from objects in the environment. Conversely, conductor 352 may be in locations on second pattern 343 that shield conductive material in first pattern 341 from objects in the environment. Alternatively or in addition to the above, switch sensor area 301 and capacitive area 302 may be spaced far enough apart in circuit assembly 300 to prevent electrodes and conductors of capacitive sensor area 302 from receiving signals from switch sensor area 301.

The preventative capacitance configuration may include conductor 396 placed on insulating member 342. Conductor 396 is held at a substantially constant voltage, such as ground. Conductor 396 is placed on insulating member where there is little or no probability of shorting with conductive components of first pattern 341 or second pattern 342. Conductor 396 may be used shield the conductive components of first pattern 341 and second pattern 343 from extraneous signals or capacitive coupling with objects in the environment. Preferably, conductor 396 is a trace of conductive material deposited on insulating member 342. Conductor 396 may also be used as shielding between at least a portion of first pattern 341 and second pattern 343 to reduce non-intended capacitive coupling between conductive material in first pattern 341 and second pattern 343.

One skilled in the art will recognize that openings in insulating member 342 may be used instead of conductor 396. The openings define air gaps between the conductive material of first pattern 341 and second pattern 343 to reduce the non-intended capacitive coupling.

Circuit assembly 300 connects conductive element 310 to keyboard electronics 392 via conductors 311. Preferably, conductors 311 are conductive traces in first pattern 341. Conductive elements 312 in second pattern 343 are connected to keyboard electronics 392 via conductors 319. Preferably, conductors 319 are traces of conductive material in second pattern 343. One skilled in the art will recognize that the conductive traces may be made of conductive inks such as but not limited to silver ink or carbon ink. One skilled in the art will appreciate that any configuration of conductive material may be used to provide the conductors.

First electrodes 321 connect to capacitive sensor electronics 391 via conductors 324. Preferably, conductors 324 are traces of conductive materials along first pattern 341. However, one skilled in the art will recognize that the conductors 324 may be routed to electronics 391 in any number of ways. To reduce non-intended capacitive coupling with other objects in the environment, conductors 324 may be as short and as thin as reasonable to decrease the area of coverage of conductors 324. To reduce non-intended capacitive coupling with other objects in the environment, conductors 324 may be routed around areas on first pattern 341 corresponding to areas, such as hand rests 155 of casing 150 (Shown in FIG. 1), proximate to other objects in the environment. Conductors 324 may also be routed around areas within casing 150 where electronics and systems not directly related to circuit assembly 300 may be located. Non-intended capacitive coupling to conductors 324 must be reduced since such non-intended capacitive coupling changes the capacitance measured by capacitive sensor electronics 391 connected to conductors 324 and introduces errors in the reading of the position of a conductive input object over the sensor. One skilled in the art will recognize that only a portion of the conductors may be routed around areas corresponding to other objects in the environment, such as hand rests 155, depending on a variety of factors including but not limited to manufacturing and design constraints as well as considerations regarding decreasing the lengths and sizes of the conductors 324. One skilled in the art will further recognize that combining keyboard sensor electronics 391 and capacitive sensing electronics 391 allows a single connector to connect conductors 311 and 324 to the respective electronics 391, 392.

Alternatively, the preventative capacitance configuration may include a conductor (Not Shown) on top cover 151 held at a substantially constant voltage over at least a portion of conductors 324 to reduce undesirable capacitive coupling with objects in the environment. An alternate embodiment of this conductor (Not Shown) may include, but not be limited to, conductive material deposited on a substrate and attached to top cover 151, conductive material deposited, painted or otherwise placed on top cover 151, and conductive material embedded within top cover 151. One skilled in the art will recognize that these shielding alternatives may be used in combination or individually to reduce capacitive coupling between the conductors and the other objects in the environment.

Conductors 325 connect second electrodes 323 to capacitive sensor electronics 391. Preferably, conductors 325 are traces of conductive material in second pattern 343. One skilled in the art will recognize that if switch sensor electronics 392 and capacitive sensor electronics 391 are combined, a single connector allows conductors 312 and 324 to connect to the respective electronics 391, 392. However, one skilled in the art will also recognize that conductors 325 may be connected to sensor electronics 391 in any number of ways. To reduce undesirable capacitive coupling with the environment, conductors 325 may be made as short or as thin as reasonable to decrease the area of coverage for conductors 325. Also to reduce undesirable capacitive coupling to other objects of the environment, the preventative capacitance configuration may include conductors 325 routed around areas of pattern 343 corresponding to area proximate other items in the environment, such as hand rests 155 of casing 150 (Shown in FIG. 1). Conductors 325 may also be routed around areas inside casing 150 where electronics and other systems not directly related to circuit assembly 300 may be located. One skilled in the art will recognize that only a portion of conductors 325 may be routed around areas corresponding to rest areas 155 depending on a variety of factors including but not limited to manufacturing and design constraints as well as considerations regarding the decreasing of the lengths and sizes of conductors 325.

Furthermore, the preventative capacitance configuration may include a conductor (Not Shown) affixed to bottom cover 152 of casing 150. The conductor (Not Shown) is held at a substantially constant voltage and is affixed to the inner surface of bottom cover 152, embedded within bottom cover 152, or attached to the outer surface of bottom cover 152.

In circuit assembly 300, alignment of first pattern 341, and second pattern 343 is important. In switch sensor area 301, alignment of a conductive element 310 with mated conductive element 312 and opening 313 must be maintained to allow contact between the contact pads in response to a force generated by keystroke input from the user. In capacitive sensor area 302, alignment of first electrodes 321 with respect to second electrodes 323 is important to determine the position of a conductive object over the electrodes. Misalignment may cause inaccurate position determinations by capacitance measuring electronics 391.

In order to facilitate alignment, circuit assembly 300 may have a coupling of the substrates on which first pattern 341 and second pattern 343 are affixed or traced. Insulating member 342 may also be coupled to first pattern 341 and second pattern 343. One manner of coupling is to deposit first pattern 341 and second pattern 343 on two sides of one substrate, such as insulating member 342. The alignment then becomes a function of manufacturing.

In the case that first pattern 341 and second pattern 343 are deposited on separate substrates, one manner of coupling first pattern 341 and second pattern 343 is having structural members 395 protruding from an inside surface of casing 150. In the shown embodiment, structural members 395 protrude upward from bottom cover 152. Alternatively, structural members 395 may also protrude from an inside of top cover 151 (not shown). Structural members 395 pass through mated openings 360, 361 in the substrates of first and second patterns 341, 343 and openings 370 in insulating member 342. One skilled in the art will recognize that openings 370 are not needed if insulating member 342 does not extend over openings 360, 361. Preferably, structural members 395 should be placed such that structural members 395 do not introduce undesirable deformation or motion within capacitive sensor area 302 during use. Each structural member 395 may be an extension of the casing 150 or a separate component attached to the casing 150. Each structural member 395 may be a screw or other standard fastener that attaches casing 150 to components (Not Shown) connected with casing 150.

An alternative manner for coupling first pattern 341 and second pattern 343 is to provide nibs (not shown) on opposing sides of insulating member 342 which are mated to openings 360, 361 in the substrates of first pattern 341 and second pattern 343. The openings 360, 361 fit over the nibs to hold first pattern 341 and second pattern 343 in place with respect to one another. Preferably, the nibs should be placed such that nibs do not introduce undesirable deformation or motion within capacitive sensor area 302 during use.

Another manner of coupling may be to heat stake the substrate of first pattern 341 and the substrate of second pattern 343 to one another. The heat staking may be done at the edges or at particular points in circuit assembly 300 away from conductive components. Another manner of coupling may be to adhere the substrates of first pattern 341 and second pattern 343 to one another. The adhesion may be done at the edges of the substrates containing patterns, at particular points in circuit assembly 300, or over entire regions of circuit assembly 300 including capacitive sensor area 302. The only requirement is that the adhesion does not prevent the proper switching action from occurring with in switch sensor area 301. These methods of coupling listed above may also be extended to align insulating member 342 to first pattern 341 and/or second pattern 343.

Besides the benefit of alignment, the coupling of first pattern 341, insulating member 342, and/or second pattern 343 may also make circuit assembly 300 more rigid. Added rigidity reduces deformations of first and second patterns 341, 343 during use that may reduce the sensitivity of the capacitive sensor device, introduce error to readings of position, or indicate false contacts in switch area 301.

Figure 11:
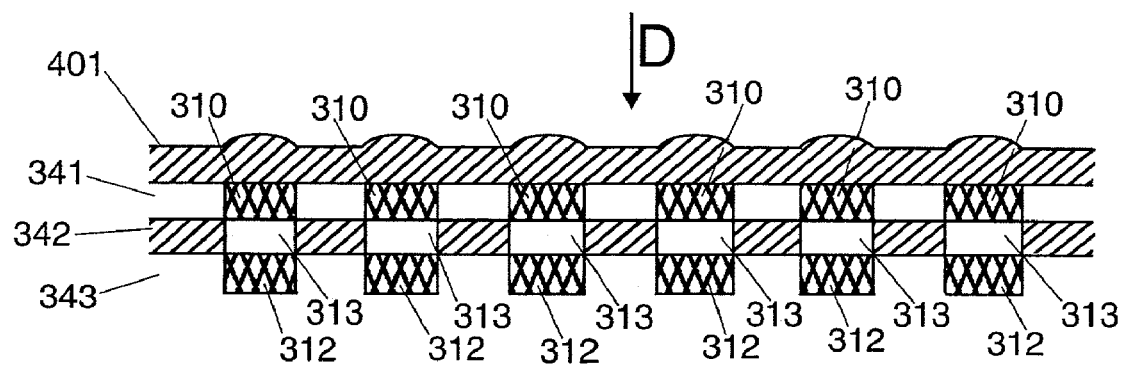
FIG. 11 illustrating a cross sectional view of a switch sensor area of sensor circuit assembly in accordance with this invention.

FIG. 11 shows a cross sectional view of a portion of switch sensor area 301 in circuit assembly 300. First pattern 341 has conductive elements 310 space apart from one another. Insulating member 342 has openings 313 through insulating member 342 which allow conductive elements 310 to pass through in response to a force being exerted on the contact in direction D. Second pattern 343 has conductive elements 312 that are mated to openings 313 and conductive elements 310. A layer of tactile material may be placed over first pattern 341 in switch sensor area 301. The tactile layer provides an aesthetic feedback to a user pressing keys. The tactile layer may also add rigidity to circuit assembly 300.

FIG. 12 is cross sectional view of a section of membrane switch sensor area having an alternative insulating member 342. In FIG. 12, insulating member 342 is made of a plurality of insulating bumps 501–502. Aligned conductive elements 310, 312 are positioned in spaces between insulating dots 501–502. This allows conductive element 310 to be forced into contact with conductive element 312 in response to a force in direction D being applied to conductive element 310.

Figure 13:
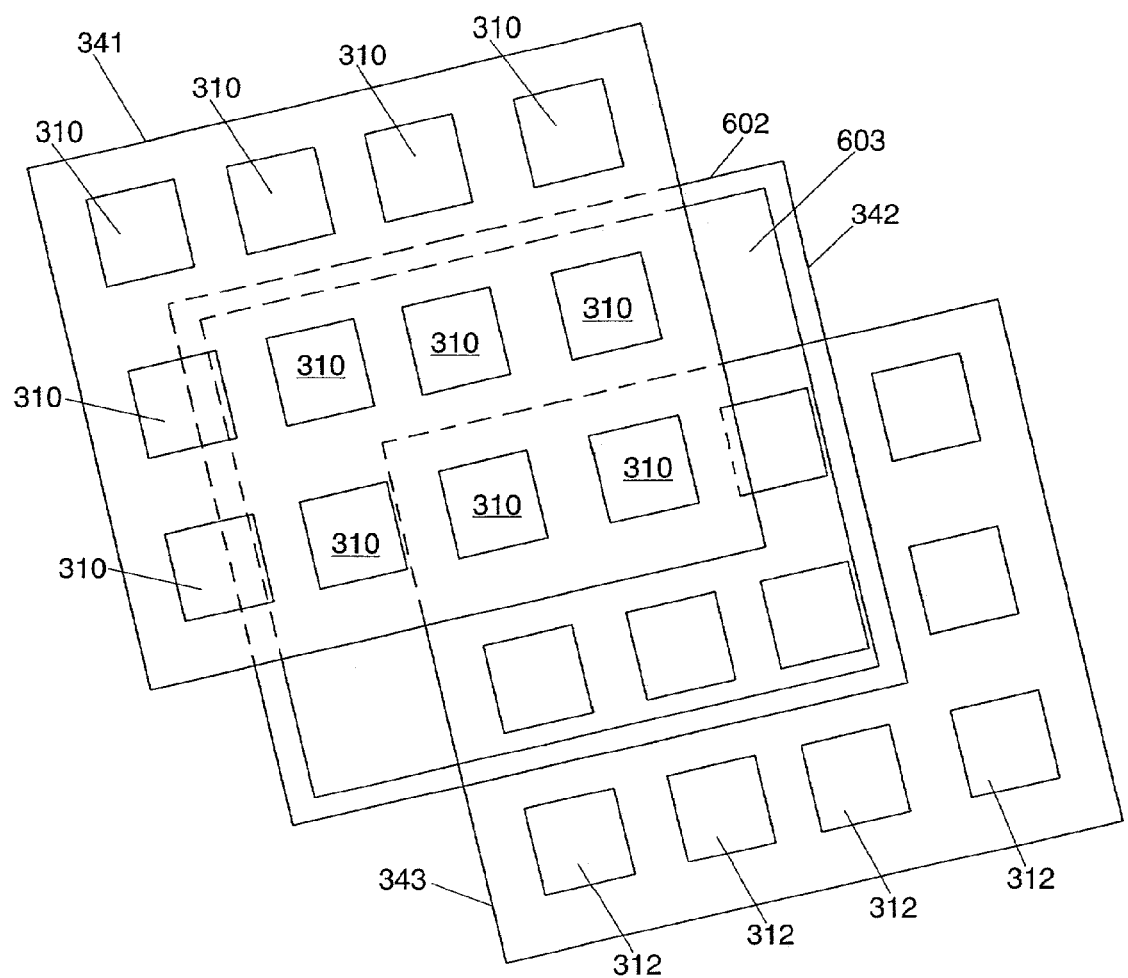
FIG. 13 illustrating a cross sectional view of a portion of a second alternative exemplary embodiment of a membrane switch area in accordance with this invention.

FIG. 13 illustrates a second alternative for insulating member 342 in membrane switch sensor area 301 in which spacer 602 is used. In FIG. 13, insulating member 342 is a spacer 602. Spacer 602 is a layer of insulating material around the perimeter a pattern of aligned conductive elements 310, 312. The pattern of aligned elements 310, 312 make contact through opening 603 of spacer 602 in response to a force in direction D being applied to an element 310.

Figure 14:
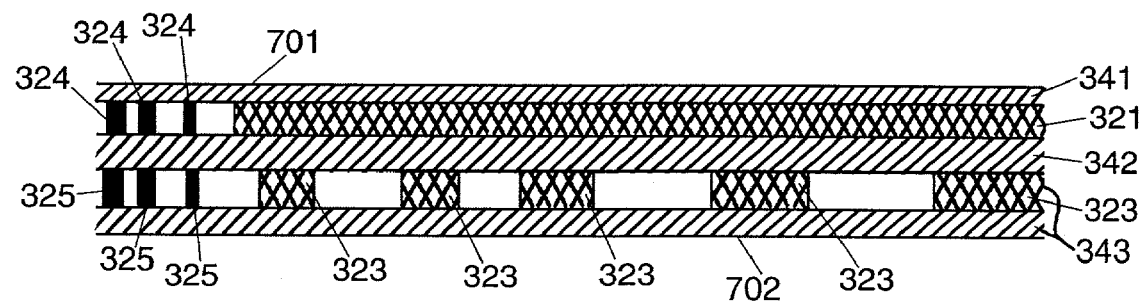
FIG. 14 illustrates a cross sectional view of a capacitive sensor area in accordance with this invention.

FIG. 14 illustrates a cross sectional view of an embodiment of capacitive sensor area 302 in accordance with this invention. In FIG. 14, first electrodes 321 of first pattern 341 are affixed to a bottom side of first substrate 701 and second electrodes 323 of second pattern 343 are affixed to a top side of bottom substrate 702. Conductors 324 of first pattern 321 are also affixed to the bottom side of top substrate 701 and conductors 325 are on the top side of bottom substrate 702. Insulating member 342 separates first pattern 341 and second pattern 343. This design is analogous to that of a conventional keyswitch sensor in which the aligned conductive elements 310 are place on a bottom side of top substrate 701 and conductive elements 312 are placed on a top side of bottom substrate 702 to face one another and facilitate contact in response to a force on a conductive element 310.

Figure 15:
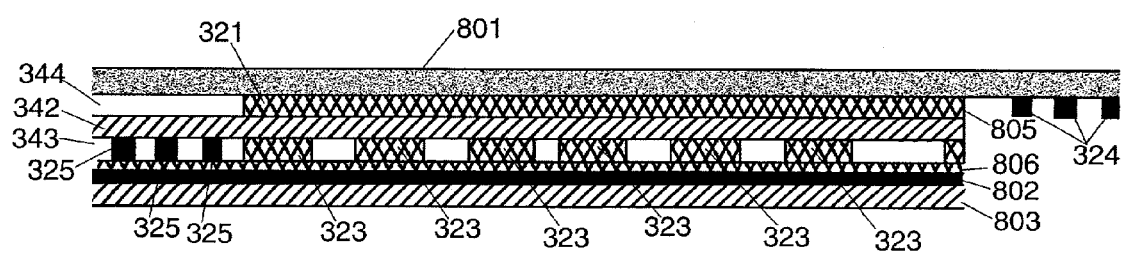
FIG. 15 illustrating a cross sectional view of an alternative capacitive sensor area of a circuit assembly in accordance with this invention.

FIG. 15 illustrates a cross section view of another exemplary embodiment of capacitive sensor area 302. Electrodes 321 in first pattern 341 are affixed to a first substrate 805 and electrodes 323 of second pattern 343 are affixed to substrate 806, insulating member 342 is between electrodes 321 and 323. Under substrate 806 is a grounding plate 802 that is a conductor held at a substantially constant voltage such as ground. Under grounding plate 802 is an insulating substrate 803. One skilled in the art will appreciate that grounding plate 802 does not actually have to be a plate, but can be any configuration of conductive material. One skilled in the art will also appreciate that there may be additional layers of materials in insulating member 342, over first pattern 341 and under second pattern 343. Conductors 325 in second pattern 343 connect electrodes 323 to sensor electronics 391 as described above and electrodes 324 in first pattern 341 connect electrodes 321 to sensor electronics 391 as described above. Protective layer 801 is a layer of material added over first pattern 341 to add stiffness to the circuit assembly and to provide an aesthetic feel for a user. Preferably, protective layer 801 is a polyester material.

Figure 16:
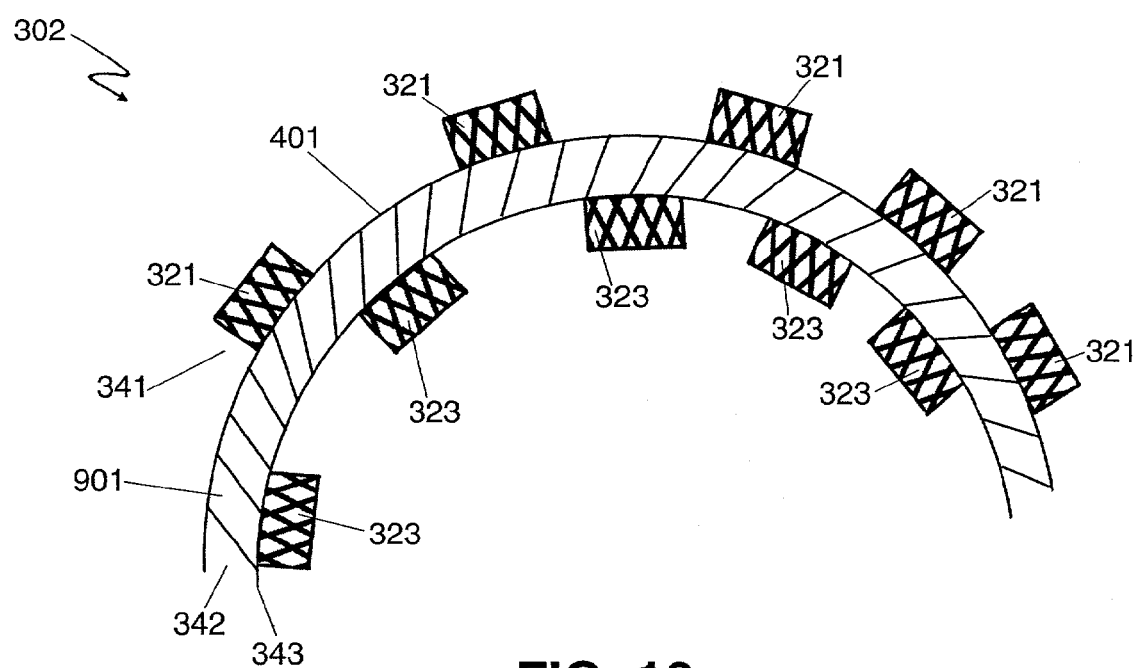
FIG. 16 illustrating a cross sectional view of an alternative a capacitive sensor area of a circuit assembly having the first and second patterns affixed to a flexible substrate in accordance with this invention FIG. 17 illustrating a cross sectional view of an installed capacitive sensor area of a circuit assembly in accordance with this invention.

FIG. 16 illustrates a cross sectional view of a portion of a second exemplary embodiment of capacitive area 302. In FIG. 16, insulating member 342 is an insulating substrate 901. Insulating substrate 901 is made of a flexible insulating material that may be folded or formed into any numbers of shapes including the semispherical shape illustrated. Those skilled in the art will appreciate that this allows capacitive sensor area 302 to be shaped into a desired form by a maker of a circuit assembly in accordance with this invention. Electrodes 321 of first pattern 341 are affixed to a first surface of insulating substrate 901. Electrodes 323 of second pattern 343 are affixed to a second surface of insulating substrate 901. One skilled in the art will recognize that different stack-ups of conductive patterns and insulating members are also viable as long as conductive patterns are prevented from contacting each other and sufficient change in capacitance occurs in the electrodes in response to a user input. For example, the conductive patterns can be deposited on the top or bottom surfaces of the associated substrate, the substrate may act as an insulating member, and more than one insulating member can be interposed between the first and second conductive patterns.

Figure 17:
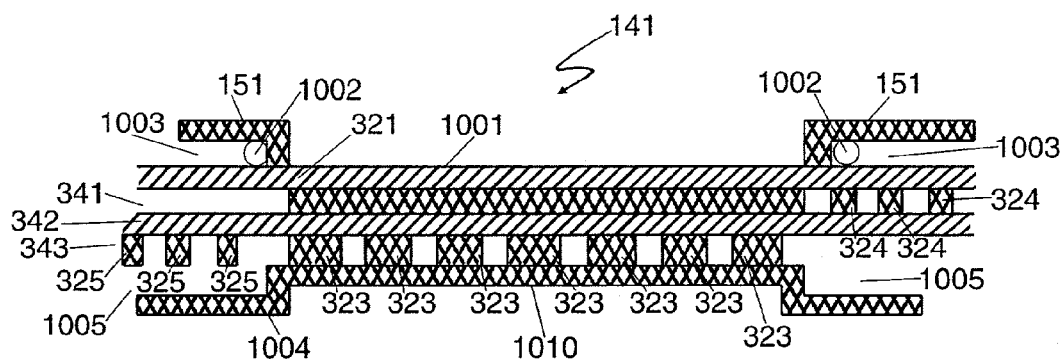

FIG. 17 is a cross sectional view of a first exemplary embodiment of capacitive sensor area 302 of circuit assembly 300 in casing 150. One skilled in the art will note that although shown in notebook computer 100, the description of FIG. 17 may be applied to any type of casing that encloses circuit assembly 300. First pattern 341 has conductors 321 that are under bezel 141. Bezel 141 includes an opening in a top cover 151 of casing 150. Electrodes 321 are aligned in a first direction parallel with the cross section. Insulating member 342 maintains separation between first pattern 341 and second pattern 343. Second pattern 343 has electrodes 323 that are aligned substantially orthogonal to electrodes 321 under bezel 141. A layer 1001 of textured material may be placed over first pattern 341. The textured material of layer 1001 provides an aesthetic sense of touch to the user and may add rigidity to circuit assembly 300. In a preferred embodiment, layer 1001 is a layer of polyester material over first pattern 341.

As shown in FIG. 17, a boss 1002 may be added proximate to bezel 141, such as around bezel 141, to clamp capacitive sensor area 302 against a surface inside back cover 152 (Shown in FIG. 1). Also, bezel 141 may be used to define air gaps 1003 between first pattern 341 and front cover 151 to reduce capacitive coupling between conductors 324 and resting or nearby body parts.

Instead of clamping directly to back cover 152, a brace 1004 may be added. One skilled in the art will recognize that brace 1004 may be an inner surface of a structure inside back cover 152 or a separate structure affixed to front cover 151 and/or back cover 152. Brace 1004 includes a localized clamping region 1010. Localized clamping region 1010 is a portion of brace 1004 elevated in a direction of second pattern 343 to hold sensor area 302 in place against bezel 141 and/or boss 1002. The elevated clamping region 1010 may be used to define air gaps 1005 between second pattern 343 and brace 1004. The air gaps 1005 reduce capacitive coupling between conductors 325 and body parts of a user resting on back cover 152. As stated above, one skilled in the art will not that that although not shown, any number of insulating substrates may be added. These are omitted for clarity.

Figure 18:
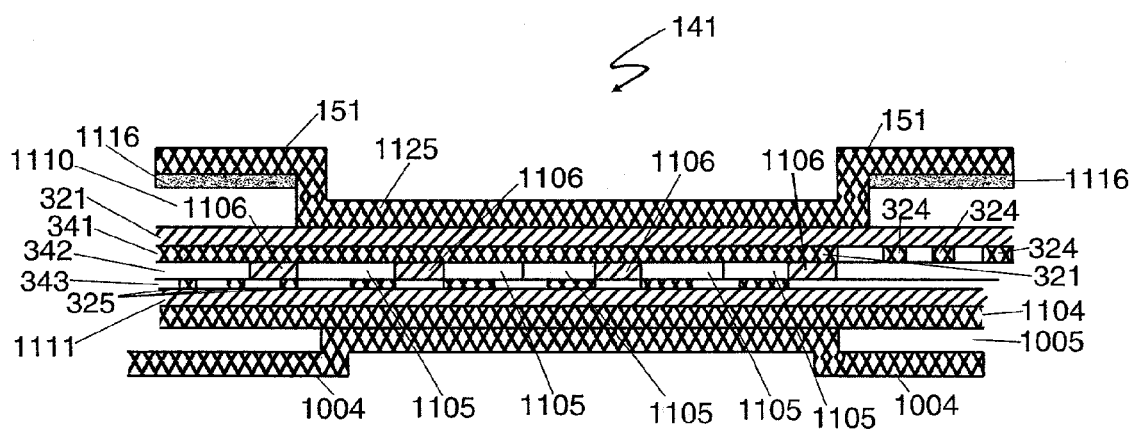
FIG. 18 illustrating a cross sectional view of an alternative exemplary embodiment of an installed capacitive sensor area of a circuit assembly in accordance with this invention.

FIG. 18 illustrates a cross sectional view of a second exemplary embodiment of capacitive sensor area 302 inside a casing 150. One skilled in the art will recognize that the concepts shown in this drawing may be applied to other types of casings besides a notebook computer shown in FIG. 1. In FIG. 18, bezel 141 is a depression 1125 in top cover 151 and does not include an opening. Electrodes 321 are substantially parallel to the cross section and proximate depression 1125. Preferably, the material of casing 150 is thin enough at depression 1125 to allow changes in capacitance in electrodes 321 and 323 when a body part of a user is proximate depression 1125. In this embodiment, where bezel 141 is a solid region in top cover 151, the top cover can be textured within capacitive sensor area 302 to yield an aesthetic fell of touch or a layer of textured material (not shown) can be placed on top cover 151.

First pattern 341 is affixed to a first insulating substrate layer 1110 and second pattern 343 is affixed to a second insulating substrate layer 1111. One skilled in the art will recognize that insulating substrate layers are added for rigidity and not essential to this invention.

In FIG. 18, insulating member 342 is made of insulating spacers 1106. Insulating spacers 1106 define air gaps 1105 that prevent cross capacitance between electrodes. Preferably, spacers 1106 define air gaps 1105 in areas corresponding to an intersection of electrodes 321 crossing over electrodes 323 as part of the preventative capacitance configuration. One skilled in the art will recognize that the use of insulating spacers 1106 to provide air gaps 1105 may be used in other embodiments other then the enclosed bezel shown in FIG. 18. One skilled in the art will further recognize that air gaps 1105 may be defined by openings in a solid sheet of insulating material when insulating member 342 is a solid piece of insulating material.

In FIG. 18, the preventative capacitance configuration may include grounding plate 1104 in capacitive sensor area 302. Grounding plate 1104 is between second pattern 343 and brace 1004. Grounding plate 1104 is a conductor held at a substantially constant voltage, such as ground. This reduces capacitive coupling between other objects on or near back cover 152 and electrodes 321 and/or conductors 324. This also reduces non-intended capacitive coupling between other objects near back cover 152 and electrodes 323 and/or conductors 325. One skilled in the art will recognize that grounding plate 1104 may be included in other embodiments that do not include brace 1004 between capacitive sensor area 302 and back cover 152.

The preventative capacitance configuration may also include grounding plate 1116. Ground plates 1116 may also be included to prevent capacitive coupling between conductors 324 and other objects near or resting on top cover 151. Ground plates 1116 are affixed to an inner surface of top cover 151 over first pattern 341. Ground plates 1116 are conductors held a substantially constant voltage, such as ground. One skilled in the art will appreciate that ground plates 1116 may be used in other embodiments that do not have the bezel 141 described in FIG. 18.

The above is a description of an integrated circuit assembly for a sensor array. It is expected that those skilled in the art can and will design alternative circuit assemblies that infringe on this invention as set forth in the claims below either literally or through the Doctrine of Equivalents.

What is claimed is:

1. A sensor circuit assembly comprising:
a switch sensor area having a first conductive element in conductive material of a first pattern oriented in a first plane, a second conductive element in conductive material of a second pattern oriented in a second plane substantially parallel to said first plane, and an insulating member that allows electrical contact between said first conductive element and said second conductive element responsive to force being applied to said first conductive element;
a capacitive sensor area having a portion of a first layer of conductive material in a first one of a group consisting of said first pattern and said second pattern; and
a preventative capacitance configuration that limits non-intentional capacitive coupling to said portion of said first layer in said capacitive sensor area.

2. The circuit assembly of claim 1 wherein said preventative capacitance configuration comprises:
a conductor held at a substantially constant voltage in said first one of said first and second patterns between said switch sensor area and said capacitive sensor area to reduce reception of signals from said switch sensor area in said capacitive sensor area.

3. The circuit assembly of claim 1 wherein said preventative capacitance configuration includes said switch sensor area and said capacitive sensor area being spaced sufficiently apart to reduce reception of signals from said switch sensor area in said capacitive sensor area.

4. The circuit assembly of claim 1 further comprising:
a first plurality of electrodes in said capacitive sensor area defined in said conductive material of said first layer aligned substantially along a first axis.

5. The circuit assembly of claim 4 further comprising:
a first plurality of conductors connecting said first plurality of electrodes to sensor electronics.

6. The circuit assembly of claim 5 wherein said first plurality of conductors comprises:
a plurality of traces of conductive material within said first layer.

7. The circuit assembly of claim 5 wherein said preventative capacitance configuration includes at least one of said first plurality of conductors being routed around areas proximate to positions of other objects in the environment.

8. The circuit assembly of claim 5 wherein said preventative capacitance configuration comprises:
shielding between other objects in the environment and said first plurality of conductors to reduce non-intended capacitive coupling between said first plurality of conductors and said other objects.

9. The circuit assembly of claim 5 wherein said preventative capacitance configuration comprises:
a casing enclosing said first plurality of conductors, said casing defining an air gap between an inner surface of said casing and said first plurality of conductors to reduce non-intended capacitive coupling between other objects in the environment and said first plurality of conductors.

10. The circuit assembly of claim 5 wherein said preventative capacitance configuration comprises:
a conductor held at a substantially constant voltage between at least a portion of said first layer and other objects in the environment to reduce non-intended capacitive coupling between said other objects in the environment and said first plurality of conductors.

11. The circuit assembly of claim 1 further comprising:
a portion of a second layer of conductive material in said capacitive sensor area.

12. The circuit assembly of claim of 11 further comprising:
a third pattern of conductive material including said second layer of said conductive material, wherein said third pattern is in a third plane substantially parallel to said first plane and said second plane.

13. The circuit assembly of claim 12 wherein a second one of a group consisting of said first pattern and said second pattern includes said third pattern of conductive material.

14. The circuit assembly of claim 13 wherein said insulating member maintains separation between said first pattern and said second pattern in said capacitive sensor area.

15. The circuit assembly of claim 11 wherein a position of said conductive input object with respect to said capacitive sensor area is determined without contact between said conductive material of said first layer and said conductive material of said second layer in said capacitive sensor area.

16. The circuit assembly of claim 11 wherein said position of said conductive input object is determined without substantial relative movement of said conductive material of said first layer and said conductive material of said second layer in said capacitive sensor area.

17. The circuit assembly of claim 11 wherein said preventative capacitance configuration limits non-intentional capacitive coupling to said second layer in said capacitive sensor area.

18. The circuit assembly of claim 17 wherein said preventative capacitance configuration comprises said insulating member having an opening in said capacitive sensor area to reduce capacitive coupling between said first layer of conductive material and said second layer of conductive material.

19. The circuit assembly of claim 17 wherein said preventative capacitance configuration comprises:
shielding between at least a portion of said conductive material in said first layer and at least a portion of said conductive material in said second layer to reduce capacitive coupling between said conductive material in said first layer and said conductive material in said second layer.

20. The circuit assembly of claim 19 wherein said shielding comprises a conductor held at a substantially constant voltage.

21. The circuit assembly of claim 19 wherein said shielding is air gaps defined by openings through said insulating member.

22. The circuit assembly of claim 17 further comprising:
a first plurality of electrodes in said capacitive sensor area defined in said conductive material of said first layer aligned substantially along a first axis; and
a second plurality of electrodes in said capacitive sensor area defined in said conductive material of said second layer and aligned substantially along a second axis nonparallel to said first axis.

23. The circuit assembly of claim 22 further comprising:
a first plurality of conductors connecting said first plurality of electrodes to capacitive sensor electronics; and
a second plurality of conductors connecting said second plurality of electrodes to said capacitive sensor electronics.

24. The circuit assembly of claim 23 wherein said first plurality of conductors comprises:
a first plurality of traces of conductive material within said first layer defining said first plurality of conductors.

25. The circuit assembly of claim 23 wherein said second plurality of conductors comprises:
a second plurality of traces of conductive material within said second layer defining said second plurality of conductors.

26. The circuit assembly of claim 23 wherein said preventative capacitance configuration comprises:
a conductor held at a substantially constant voltage between at least a portion of said second layer and other objects in the environment to reduce non-intended capacitive coupling between said other objects in the environment and said second plurality of conductors.

27. The circuit assembly of claim 23 wherein said preventive capacitance configuration comprises:
shielding between at least part of said first plurality of conductors and positions of other objects in the environment to reduce non-intended capacitive coupling effects between said other objects and said first plurality of conductors.

28. The circuit assembly of claim 23 wherein said preventive capacitance coupling configuration comprises:
shielding between at least a part of said second plurality of conductors and positions of other objects in the environment to reduce non-intended coupling effects of between said other objects and said second plurality of conductors.

29. The circuit assembly of claim 23 wherein said preventative capacitance configuration comprises:
at least one of said first plurality of conductors being routed around areas corresponding to regions of said casing proximate to positions of other objects in the environment.

30. The circuit assembly of claim 23 wherein preventative capacitance configuration comprises:
at least one of said second plurality of conductors being routed around areas corresponding to regions of said casing proximate other objects in the environment.

31. The circuit assembly of claim 23 wherein said preventative capacitance configuration comprises:
a casing enclosing said second plurality of conductors, said casing defining an air gap between an inner surface of said casing and said second plurality of conductors to reduce non-intended capacitive coupling between other objects in the environment and said second plurality of conductors.

32. The circuit assembly of claim 1 wherein said preventative capacitance configuration comprises:
a casing enclosing said switch sensor area and said capacitive sensor area.

33. The circuit assembly of claim 32 further comprising:
a bezel in a first surface of said casing demarking said capacitive sensor area to said user.

34. The circuit assembly of claim 33 wherein said bezel comprises an opening in said casing.

35. The circuit assembly of claim 33 wherein said bezel comprises a textured region over said capacitive sensor area.

36. The circuit assembly of claim 33 further comprising:
a brace member proximate to said bezel for clamping said first layer in said capacitive sensor area in place against a second surface inside said casing.

37. The circuit assembly of claim 36 further comprising:
a localized clamping region of said brace member proximate to said capacitive sensor area to hold said first layer in said capacitive sensor area in place against said bezel.

38. The circuit assembly of claim 33 further comprising:
a brace member for holding said first layer of said capacitive sensor area in place against said bezel.

39. The circuit assembly of claim 1 further comprising:
a registration member that secures a position of said first pattern with respect to said second pattern.

40. The circuit assembly of claim 39 wherein said registration member secures said insulating member in place with respect to said first pattern and said second pattern.

41. The circuit assembly of claim 39 wherein said registration member comprises:
a coupling of said first pattern and said second pattern that holds said first pattern, and said second pattern substantially in place with respect to one another.

42. The circuit assembly of claim 41 wherein said coupling provides stiffness to said circuit assembly.

43. The circuit assembly of claim 41 wherein said coupling is a heat staking connecting said first pattern and said second pattern.

44. The circuit assembly of claim 41 wherein said coupling comprises:
an adhesive connecting substrates of said first pattern and said second pattern.

45. The circuit assembly of claim 41 wherein said coupling comprises:
a substrate having said first pattern on a first side and said second pattern on a second side.

46. The circuit assembly of claim 39 wherein said registration member comprises:
a nib on a first surface of said insulating member; and
an opening through a substrate of said first pattern that mates to and fits over said nib to secure said first pattern in place with respect to said nib.

47. The circuit assembly of claim 46 wherein said registration member further comprises:
a nib on a second surface of said insulating member; and
an opening through a substrate of said second pattern that mates to and fits over said nib to secure said second pattern in place with respect to said nib.

48. The circuit assembly of claim 39 wherein said registration member comprises:
a structural member on an inner surface of a casing that mates to and fits in an opening through said first pattern and an opening through said second pattern.

49. The circuit assembly of claim 1 further comprising:
a layer of textured material over said capacitive sensor area.

50. The circuit assembly of claim 49 wherein said layer of textured material provides an aesthetic feeling of touch to said user.

51. The circuit assembly of claim 49 wherein said layer of textured material stiffens said circuit assembly.

52. The circuit assembly of claim 49 wherein said textured material is a polyester material.

53. A method for configuring a sensor circuit assembly comprising:
defining a switch sensor area having a first conductive element in conductive material of a first pattern oriented in a first plane, a second conductive element in conductive material of a second pattern oriented in a second plane substantially parallel to said first plane, and an insulating member that allows electrical contact between said first conductive element and said second conductive element responsive to force being applied to said first conductive element;
defining a capacitive sensor area having a portion of a first layer of conductive material in a first one of a group consisting of said first pattern and said second pattern; and
limiting non-intentional capacitive coupling to said portion of said first layer in said capacitive sensor area.

54. The method of claim 53 wherein said step of limiting non-intentional coupling comprises:
positioning a conductor held at a substantially constant voltage in said first one of said first and second patterns between said switch sensor area and said capacitive sensor area to reduce reception of signals from said switch sensor area in said capacitive sensor area.

55. The method of claim 53 wherein step of limiting non-intentional capacitive coupling includes spacing said switch sensor area and said capacitive sensor area sufficiently apart to reduce reception of signals from said switch sensor area in said capacitive sensor area.

56. The method of claim 53 further comprising:
defining a first plurality of electrodes in said capacitive sensor area in said conductive material of said first layer aligned substantially along a first axis.

57. The method of claim 56 further comprising:
connecting said first plurality of electrodes to sensor electronics with a first plurality of conductors.

58. The method of claim 57 wherein said step of connecting comprises:
defining a plurality of traces of conductive material within said first layer to act as a first plurality of conductors.

59. The method of claim 57 wherein said step of limiting said non-intentional capacitive coupling comprises:
routing at least one of said first plurality of conductors around areas proximate to positions of other objects in the environment.

60. The method of claim 57 wherein said step of limiting non-intentional capacitive coupling comprises:
shielding said first plurality of conductors from other objects in the environment to reduce non-intended capacitive coupling between said first plurality of conductors and said other objects.

61. The method of claim 57 wherein said step of limiting said non-intentional capacitive coupling comprises:
enclosing said first plurality of conductors in a casing defining an air gap between an inner surface of said casing and said first plurality of conductors to reduce non-intended capacitive coupling between other objects in the environment and said first plurality of conductors.

62. The method of claim 57 wherein said step of limiting said non-intentional capacitive coupling comprises:
positioning a conductor held at a substantially constant voltage between at least a portion of said first layer and other objects in the environment to reduce non-intended capacitive coupling between said other objects in the environment and said first plurality of conductors.

63. The method of claim 53 further comprising:
defining a portion of a second layer of conductive material in said capacitive sensor area.

64. The method of claim of 63 wherein a third pattern of conductive material includes said second layer of said conductive material, wherein said third pattern is in a third plane substantially parallel to said first plane and said second plane.

65. The circuit assembly of claim 63 wherein a second one of a group consisting of said first pattern and said second pattern includes said third pattern of conductive material, said method further comprising:
maintaining separation between said first pattern and said second pattern in said capacitive sensor area with said insulating member.

66. The method of claim 63 wherein a position of said conductive input object with respect to said capacitive sensor area is determined without contact between said conductive material of said first layer and said conductive material of said second layer in said capacitive sensor area.

67. The method of claim 63 wherein said position of said conductive input object is determined without substantial relative movement of said conductive material of said first layer and said conductive material of said second layer in said capacitive sensor area.

68. The method of claim 63 said step of limiting said non-intentional capacitive coupling further comprises:
limiting non-intentional capacitive coupling to said second layer in said capacitive sensor area.

69. The method of claim 68 wherein said step of limiting said non-intentional capacitive coupling comprises:
defining an opening through said insulating member in said capacitive sensor area to reduce capacitive coupling between said first layer of conductive material and said second layer of conductive material.

70. The method of claim 68 wherein said step of limiting said non-intentional capacitive coupling comprises:
shielding at least a portion of said conductive material in said first layer from at least a portion of said conductive material in said second layer to reduce capacitive coupling between said conductive material in said first layer and said conductive material in said second layer.

71. The method of claim 63 further comprising:
defining a first plurality of electrodes in said capacitive sensor area defined in said conductive material of said first layer aligned substantially along a first axis; and
defining a second plurality of electrodes in said capacitive sensor area defined in said conductive material of said second layer and aligned substantially along a second axis nonparallel to said first axis.

72. The method of claim 71 further comprising:
connecting said first plurality of electrodes to capacitive sensor electronics with a first plurality of conductors; and
connecting said second plurality of electrodes to said capacitive sensor electronics with a second plurality of conductors.

73. The method of claim 72 wherein said step of connecting with said second plurality of conductors comprises:
defining a second plurality of traces of conductive material within said second layer defining said second plurality of conductors.

74. The method of claim 72 wherein said step of limiting said non-intentional capacitive coupling comprises:
positioning a conductor held at a substantially constant voltage between at least a portion of said second layer and other objects in the environment to reduce non-intended capacitive coupling between said other objects in the environment and said second plurality of conductors.

75. The method of claim 72 wherein said step of limiting said non-intentional capacitive coupling comprises:
shielding at least part of said first plurality of conductors from other objects in the environment to reduce non-intended capacitive coupling effects between said other objects and said first plurality of conductors.

76. The method of claim 72 wherein said step of limiting said non-intentional capacitive coupling comprises:
shielding at least a part of said second plurality of conductors from other objects in the environment to reduce non-intended coupling effects of between said other objects and said second plurality of conductors.

77. The method of claim 72 wherein said step of limiting said non-intentional capacitive coupling comprises:
routing at least one of said first plurality of conductors around areas corresponding to regions of said casing proximate to positions of other objects in the environment.

78. The method of claim 72 wherein said step of limiting said non-intentional capacitive coupling comprises:
routing at least one of said second plurality of conductors around areas corresponding to regions of said casing proximate other objects in the environment.

79. The method of claim 72 wherein said step of limiting said non-intentional capacitive coupling comprises:
enclosing said second plurality of conductors in a casing defining an air gap between an inner surface of said casing and said second plurality of conductors to reduce non-intended capacitive coupling between other objects in the environment and said second plurality of conductors.

80. The method of claim 53 wherein said step of limiting said non-intentional capacitive coupling comprises:
enclosing said switch sensor area and said capacitive sensor area in a casing.

81. The method of claim 80 further comprising:
defining a bezel in a first surface of said casing demarking said capacitive sensor area to said user.

82. The method of claim 81 wherein said bezel comprises an opening in said casing.

83. The circuit assembly of claim 81 wherein defining said bezel comprises:
placing a textured region over said capacitive sensor area.

84. The method of claim 81 further comprising:
clamping said first layer in said capacitive sensor area in place against a second surface inside said casing with a brace member proximate said bezel.

85. The method of claim 53 further comprising:
securing a position of said first pattern with respect to said second pattern.

86. The method of claim 85 further comprising:
securing said insulating member in place with respect to said first pattern and said second pattern.

87. The method of claim 85 wherein said step of securing comprises:
coupling said first pattern to said second pattern to hold said first pattern, and said second pattern substantially in place with respect to one another.

88. The method of claim 53 further comprising:
inserting a layer of textured material over said capacitive sensor area.

* * * * *